United States Patent
Zang et al.

(10) Patent No.: US 10,658,394 B2
(45) Date of Patent: May 19, 2020

(54) ARRAY SUBSTRATE AND MANUFACTURING METHOD THEREOF, DISPLAY PANEL AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Pengcheng Zang, Beijing (CN); Yuanjie Xu, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 0 days.

(21) Appl. No.: 15/737,087

(22) PCT Filed: Jun. 7, 2017

(86) PCT No.: PCT/CN2017/087445
§ 371 (c)(1),
(2) Date: Dec. 15, 2017

(87) PCT Pub. No.: WO2018/054098
PCT Pub. Date: Mar. 29, 2018

(65) Prior Publication Data
US 2018/0366491 A1    Dec. 20, 2018

(30) Foreign Application Priority Data

Sep. 26, 2016 (CN) ......................... 2016 1 0849815

(51) Int. Cl.
*H01L 27/12* (2006.01)
*G02F 1/1343* (2006.01)
*G02F 1/1362* (2006.01)

(52) U.S. Cl.
CPC .......... *H01L 27/124* (2013.01); *G02F 1/1343* (2013.01); *G02F 1/136213* (2013.01);
(Continued)

(58) Field of Classification Search
CPC ............... H01L 27/124; H01L 27/1259; G02F 1/136286; G02F 1/136213; G02F 1/136227; G02F 1/1343; G02F 2201/40
See application file for complete search history.

(56) References Cited

U.S. PATENT DOCUMENTS

| 2015/0001541 A1* | 1/2015 | Shin ..................... H01L 29/6675 257/59 |
| 2015/0340000 A1* | 11/2015 | Wang .................. G09G 3/3685 345/92 |
| 2017/0060317 A1* | 3/2017 | Kim ...................... G06F 3/0416 |

FOREIGN PATENT DOCUMENTS

| CN | 101582423 A | 11/2009 |
| CN | 103185997 A | 7/2013 |

(Continued)

OTHER PUBLICATIONS

The International Search Report and Written Opinion dated Aug. 30, 2017; PCT/CN2017-087445.

*Primary Examiner* — Thanh Y. Tran

(57) ABSTRACT

An array substrate and a manufacturing method thereof, a display panel and a display device are provided. The array substrate includes: a base substrate; a first electrode layer including a plurality of pixel electrode pairs arranged in an array, each of the plurality of pixel electrode pairs (1110; 2100) including a first pixel electrode and a second pixel electrode adjacent to the first pixel electrode in a row
(Continued)

direction; and a first common portion, an orthographic projection of the first common portion on the base substrate being at least partially overlapped with an orthographic projection of at least one of adjacent first pixel electrode or second pixel electrode of two adjacent pixel electrode pairs in the row direction on the base substrate.

18 Claims, 7 Drawing Sheets

(52) U.S. Cl.
CPC .. *G02F 1/136227* (2013.01); *G02F 1/136286* (2013.01); *H01L 27/1255* (2013.01); *H01L 27/1259* (2013.01); *G02F 2201/40* (2013.01)

(56) References Cited

FOREIGN PATENT DOCUMENTS

| | | |
|---|---|---|
| CN | 106449652 A | 2/2017 |
| WO | 2013/139148 A1 | 9/2013 |

* cited by examiner

ARRAY SUBSTRATE AND MANUFACTURING METHOD THEREOF, DISPLAY PANEL AND DISPLAY DEVICE

TECHNICAL FIELD

The embodiments of the present disclosure relate to an array substrate, a manufacturing method thereof, a display panel and a display device.

BACKGROUND

Twisted nematic liquid crystal displays are widely used in the display field due to their good time response, good contrast and good transmittance characteristics. With the continuous development of display technology, higher and higher demand for resolution of liquid crystal display panel is proposed. Cost of integrated circuit (IC) increases, and yield rate of pressing welding decreases, with the improvement of resolution. In order to reduce IC cost, some panel designs adopt double gate line design. Double gate line design refers to provide two gate lines for each row of pixels, and two adjacent columns of pixels share one data line. Because the cost of the data line driver IC is lower than that of the gate line driver IC, the overall IC cost of the liquid crystal display device is reduced. However, the double gate line design will reduce aperture ratio of a liquid crystal display panel.

SUMMARY

The embodiments of the present disclosure provide an array substrate, comprising: a base substrate; a first electrode layer comprising a plurality of pixel electrode pairs arranged in an array, each of the pixel electrode pairs comprising a first pixel electrode and a second pixel electrode which is adjacent to the first pixel electrode in a row direction; a data line disposed between the first pixel electrode and the second pixel electrode of a same pixel electrode pair in the row direction and extending in a column direction; and a first common portion, an orthographic projection of the first common portion on the base substrate being at least partially overlapped with an orthographic projection of at least one of adjacent first pixel electrode or second pixel electrode of two adjacent pixel electrode pairs in the row direction on the base substrate, the first common portion and the first electrode layer being insulated from each other.

In one example, the data line and the first common portion is included in a second electrode layer which is different from the first electrode layer.

In one example, the first common portion is a first common line extending in the column direction.

In one example, the array substrate further comprising: a third electrode layer disposed on the base substrate; a gate insulation layer disposed on the third electrode layer, the data line and the first common portion being disposed on the gate insulation layer; and an insulation layer disposed on the data line and the first common portion, the first electrode layer being disposed on the insulation layer.

In one example, the third electrode layer comprises a second common line, an orthographic projection of the second common line on the base substrate is overlapped with an orthographic projection of the first common portion on the base substrate.

In one example, an orthographic projection of the second common line on the base substrate is not overlapped with an orthographic projection of the first pixel electrode and second pixel electrode adjacent to each other on the base substrate.

In one example, the third electrode layer comprises a third common line which extends in the row direction, and an orthographic projection of the third common line on the base substrate is at least partially overlapped with an orthographic projection of at least one of the first pixel electrode or the second pixel electrode of at least one of the pixel electrode pairs on the base substrate.

In one example, the first common portion is electrically connected with the third common line.

In one example, the array substrate further comprising at least one of a fourth common line or a fifth common line, wherein the fourth common line is disposed on a first side of the data line, and an orthographic projection of the first pixel electrode adjacent to the data line on the base substrate is at least partially overlapped with an orthographic projection of the fourth common line on the base substrate; and the fifth common line is disposed on a second side of the data line opposite to the first side, and an orthographic projection of the second pixel electrode adjacent to the data line on the base substrate is at least partially overlapped with an orthographic projection of the fifth common line on the base substrate.

In one example, at least one of the fourth common line or the fifth common line is included in a third electrode layer.

In one example, the array substrate further comprising at least one of a sixth common line or a seventh common line, wherein the sixth common line is disposed on a first side of the data line, and an orthographic projection of the first pixel electrode adjacent to the data line on the base substrate is at least partially overlapped with an orthographic projection of the sixth common line on the base substrate; and the seventh common line is disposed on a second side of the data line opposite to the first side, and an orthographic projection of the second pixel electrode adjacent to the data line on the base substrate is at least partially overlapped with an orthographic projection of the seventh common line on the base substrate.

In one example, at least one of the sixth common line or the seventh common line is included in a second electrode layer.

Another embodiment of the present disclosure provides a display panel comprising one of the above-mentioned array substrate.

Another embodiment of the present disclosure provides a display device comprising the above-mentioned display panel.

Another embodiment of the present disclosure provides a manufacturing method of an array substrate, comprising: providing a base substrate; forming a data line and a first common portion on the base substrate; and forming a first electrode layer on the data line and the first common portion; wherein, a first electrode layer comprises a plurality of pixel electrode pairs arranged in an array, each of the pixel electrode pairs comprises a first pixel electrode and a second pixel electrode which is adjacent to the first pixel electrode in a row direction; the data line is disposed between the first pixel electrode and the second pixel electrode of a same pixel unit pair in the row direction; and the first common portion is located between two pixel electrode pairs in the row direction, an orthographic projection of the first common portion on the base substrate is at least partially overlapped with an orthographic projection of the pixel electrode of two pixel electrode pairs on the base substrate, the first common portion and the first electrode layer are insulated from each other.

In one example, the method further comprising: forming a third electrode layer on the base substrate; forming a gate insulation layer on the third electrode layer, the data line and the first common portion being located on the gate insulation layer.

In one example, the third electrode layer comprises a second common line, an orthographic projection of the second common line on the base substrate is overlapped with an orthographic projection of the first common portion on the base substrate.

In one example, the third electrode layer comprises a third common line which extends in the row direction, and an orthographic projection of the third common line on the base substrate is at least partially overlapped with an orthographic projection of at least one of the first pixel electrode or the second pixel electrode of at least one of the pixel electrode pairs on the base substrate.

In one example, the method further comprising forming at least one of a fourth common line or a fifth common line, wherein the fourth common line is disposed on a first side of the data line, and an orthographic projection of the first pixel electrode adjacent to the data line on the base substrate is at least partially overlapped with an orthographic projection of the fourth common line on the base substrate; and the fifth common line is disposed on a second side of the data line opposite to the first side, and an orthographic projection of the second pixel electrode adjacent to the data line on the base substrate is at least partially overlapped with an orthographic projection of the fifth common line on the base substrate.

In one example, the method further comprising forming at least one of a sixth common line or a seventh common line, wherein the sixth common line is disposed on a first side of the data line, and an orthographic projection of the first pixel electrode adjacent to the data line on the base substrate is at least partially overlapped with an orthographic projection of the sixth common line on the base substrate; and the seventh common line is disposed on a second side of the data line opposite to the first side, and an orthographic projection of the second pixel electrode adjacent to the data line on the base substrate is at least partially overlapped with an orthographic projection of the seventh common line on the base substrate.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 1 (b) is a schematic cross-sectional view taken along line AA' of the array substrate as illustrated in FIG. 1 (a);

FIG. 2 (b) is a schematic cross-sectional view taken along line A-A' of the array substrate as illustrated in FIG. 2 (a);

FIG. 5 (b) is a cross-sectional view taken along line A-A' of the array substrate as illustrated in FIG. 5 (a);

FIG. 5 (c) is a schematic cross-sectional view of another structure of an array substrate according to still another embodiment of the present disclosure;

FIG. 5 (d) is a schematic cross-sectional view of still another structure of an array substrate according to still another embodiment of the present disclosure;

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The phrases "connect", "connected", etc., are not intended to define a physical connection or mechanical connection, but can include an electrical connection, directly or indirectly.

Figure 1:
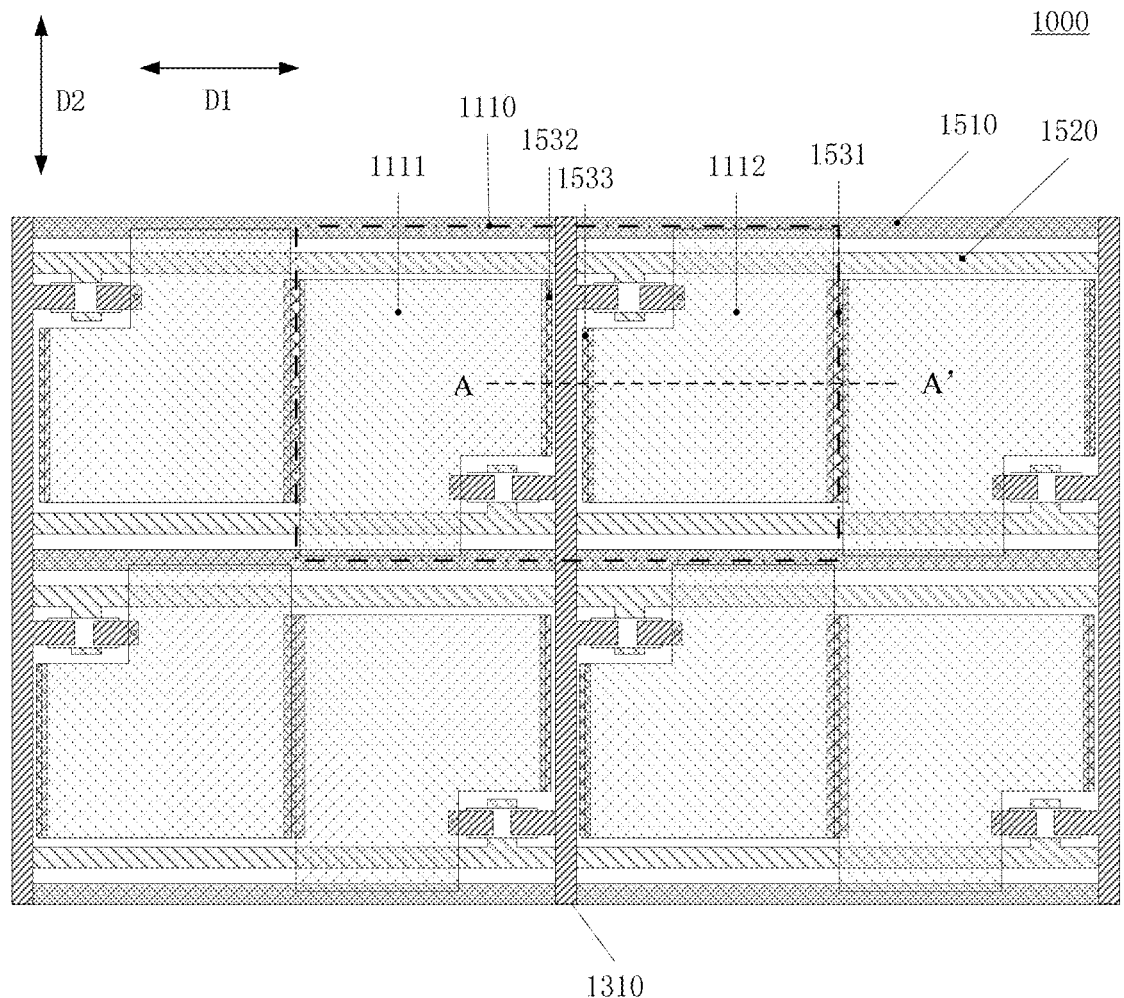
FIG. 1 (a) is a plan view of a structure of an array substrate.
Figure 1:
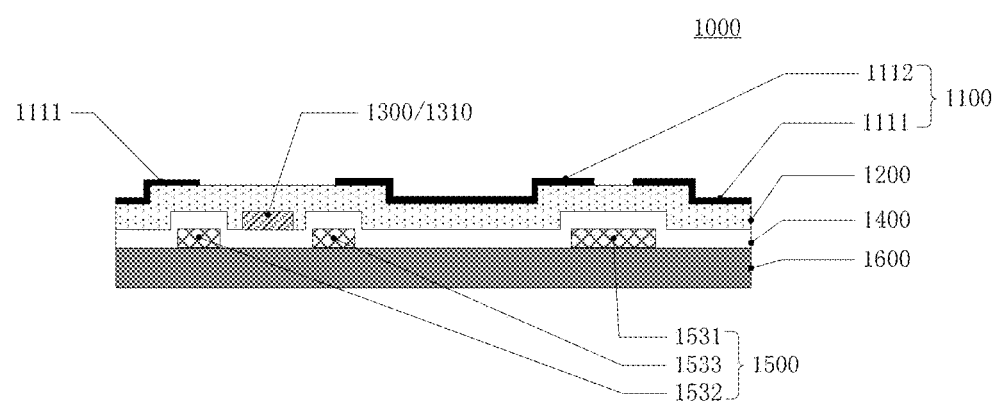

For example, FIG. 1 (a) and FIG. 1 (b) respectively illustrate a plan structure diagram and a cross-sectional structural diagram of an array substrate 1000. The schematic cross-sectional structure illustrated in FIG. 1 (b) is obtained along line AA' of the array substrate as illustrated in FIG. 1 (a).

As illustrated in the figures, the array substrate 1000 includes a base substrate 1600, a third electrode layer 1500, a gate insulation layer 1400, a second electrode layer 1300, a passivation layer 1200 and a first electrode layer 1100 which are disposed sequentially. The first electrode layer 1100 includes a plurality of pixel electrodes arranged in an array, and two adjacent pixel electrodes in a row direction (that is, direction D1 as illustrated in FIG. 1 (a)) form a pixel electrode pair 1110. Each of the pixel electrode pairs 1110 includes a first pixel electrode 1111 and a second pixel electrode 1112 which is adjacent to the first pixel electrode in the row direction (that is, the direction D1 as illustrated in FIG. 1 (a)). The second electrode layer 1300 includes a data line 1310 disposed between the first pixel electrode 1111 and the second pixel electrode 1112 in the row direction and extending in the column direction (that is, direction D2 as illustrated in FIG. 1 (a)). The third electrode layer 1500 includes a third common line 1510, a gate line 1520, a second common line 1531, a fourth common line 1532 and a fifth common line 1533. The third common line 1510 is disposed between two pixel electrode pairs 1110 adjacent in the column direction and extends in the row direction, and can be overlapped with at least one pixel electrode of one pixel electrode pair. The gate lines 1520 are disposed on both sides of each third common line 1510 and substantially parallel with the third common line 1510. The second common line 1531 is disposed between two pixel electrode pairs 1110 adjacent in the row direction and extends in the column direction, and the second common line 1531 is partially overlapped with the pixel electrode of the pixel electrode pairs on both sides of the second common line (for example, the first pixel electrode 1111 in a pixel electrode pair and the second pixel electrode 1112 in the other pixel electrode pair adjacent thereto). The fourth common line 1532 is disposed at a side of the data line 1310 and partially overlapped with the pixel electrode (for example, the first pixel electrode 1111) adjacent to the data line 1310 on the same side. The fifth common line 1533 is disposed on the other side of the data line 1310 and partially overlapped with the pixel electrode (for example, the second pixel electrode 1112) adjacent to the data line 1310 on the same other side.

For example, as illustrated in FIG. 1 (a) and FIG. 1 (b), a pixel unit where the second pixel electrode 1112 is located will be described as an example. The third common line 1510 is partially overlapped with the second pixel electrode 1112 to form a storage capacitor. The second common line 1531 and the fifth common line 1533 are partially overlapped with the second pixel electrode 1112 respectively to form an overlapped portion. The overlapped portion can form a storage capacitor, and can also shield leakage light and improve display contrast.

Embodiments of the present disclosure provide an array substrate, a manufacturing method thereof, a display panel and a display device, capable of improving aperture ratio without increasing processes, can enhance stability of storage capacitor, and can further improve stability of display image.

Figure 2:
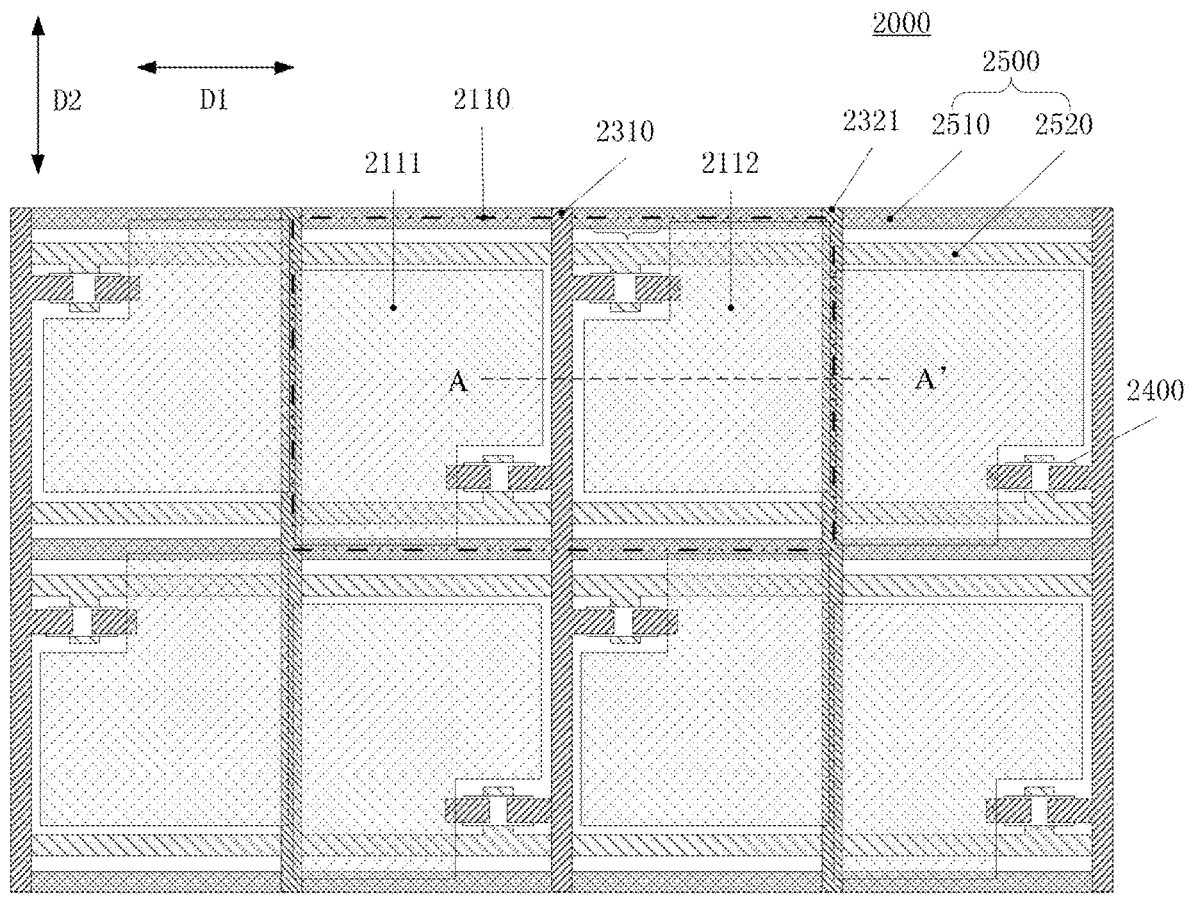
FIG. 2 (a) is a schematic plan view of a structure of an array substrate according to an embodiment of the present disclosure.
Figure 2:
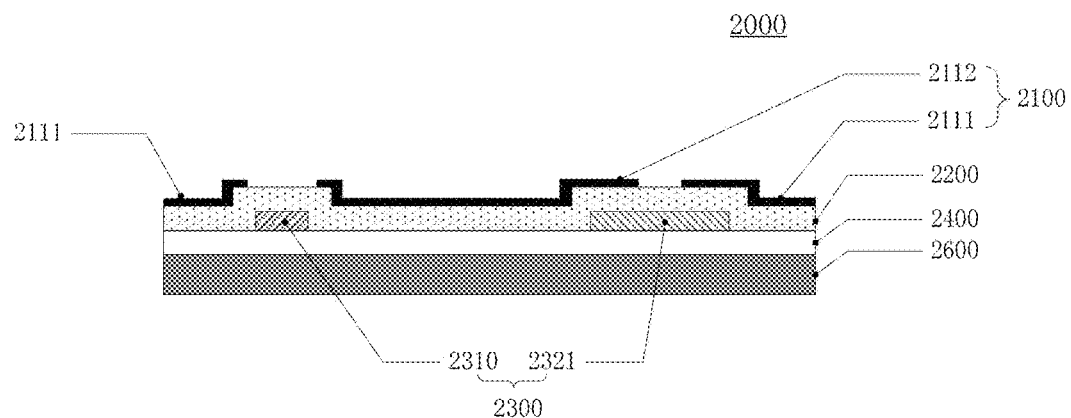

For example, FIG. 2 (a) and FIG. 2 (b) are respectively a schematic plan view and a cross-sectional view of a structure of an array substrate 2000 according to an embodiment of the present disclosure. The schematic cross-sectional structure as illustrated in FIG. 2 (b) is obtained along line AA' of the array substrate 2000 as illustrated in FIG. 2 (a).

The array substrate 2000 includes a first electrode layer 2100, a second electrode layer 2300 and an insulation layer 2200. The first electrode layer 2100 includes a plurality of pixel electrodes arranged in an array, and two adjacent pixel electrodes in a row direction (for example, direction D1 as illustrated in FIG. 2 (a)) form a pixel electrode pair 2110. Each pixel electrode pair 2110 includes a first pixel electrode 2111 and a second pixel electrode 2112 which is adjacent to the first pixel electrode 2111 in the row direction. The second electrode layer 2300 includes a data line 2310 and a first common line 2321 (for example, as an example of a first common portion). The data line 2310 is disposed between the first pixel electrode 2111 and the second pixel electrode 2112 in the row direction and extends in the column direction. The first common line 2321 is disposed between two pixel electrode pairs 2110 adjacent in the row direction and extends in the column direction (for example, direction D2 as illustrated in FIG. 2 (a)). The first common line 2321 is partially overlapped with the pixel electrode in the two pixel electrode pairs 2110 (for example, the first pixel electrode in one pixel electrode pair 2111 and the second pixel electrode 2112 in the other pixel electrode pair adjacent thereto). The insulation layer 2200 is disposed between the first electrode layer 2100 and the second electrode layer 2300 to insulate the first electrode layer from the second electrode layer.

For example, in the embodiments of the present disclosure, as illustrated in FIG. 2 (a) and FIG. 2 (b), the array substrate 2000 further includes a base substrate 2600, a third electrode layer 2500 disposed on the base substrate 2600 and a gate insulation layer 2400 disposed on the third electrode layer 2500. For example, the third electrode layer 2500 can include a gate line 2520. For example, the second electrode layer 2300 is disposed on the gate insulation layer 2400, the insulation layer 2200 is disposed on the second electrode layer 2300, and the first electrode layer 2100 is disposed on the insulation layer 2200.

For example, in the embodiments of the present disclosure, the pixel electrode can be formed of, for example, a transparent conductive material. For example, the transparent conductive material is indium tin oxide (ITO) or indium zinc oxide (IZO).

For example, the first common line 2321 and the data line 2310 can be formed of, for example, a metal material (for example, copper, aluminum or aluminum alloy).

For example, the insulation layer 2200 can be formed of an inorganic or organic material. For example, the insulation layer 2200 can be formed of an organic resin, silicon oxide (SiOx), silicon oxynitride (SiNxOy), or silicon nitride (SiNx).

For example, in an embodiment of the present disclosure, the base substrate 2600 can be a glass substrate, a quartz substrate, or a substrate made of other suitable materials. A material of the third electrode layer 2500 can be copper, aluminum, aluminum alloy or other suitable material. A material of the gate insulation layer 2400 can be silicon oxide (SiOx), silicon oxynitride (SiNxOy), or silicon nitride (SiNx) or other suitable materials.

For example, in the embodiment of the present disclosure, a portion where the pixel electrode and the first common line 2321 overlap with each other forms a storage capacitor. Capacitance c of a storage capacitor can be determined by the capacitance formula $c=\varepsilon S/d$, where, $\varepsilon$ is a dielectric constant of the insulation layer 2200 between the pixel electrode and the first common line 2321, S is an overlapped area of the pixel electrode and the first common line 2321, and d is a perpendicular distance between the pixel electrode and the first common line 2321. Because only the insulation layer 2200 is provided between the pixel electrode and the first common line 2321, compared with the case as illustrated in FIGS. 1 (a) and 1 (b), the perpendicular distance d between the pixel electrode and the first common line 2321 can be reduced. Therefore, storage capacitance between the pixel electrodes 2112 and 2111 and the first common line 2321 can be increased under the same insulation layer preparation condition. Therefore, in a case that the same capacitance value c is to be reached, the overlapped area S of the pixel electrodes 2112 and 2111 and the first common line 2321 can be reduced accordingly. That is, an area occupied by the first common line 2321 can be reduced accordingly (for example, a width of the first common line can be reduced to reduce the occupied area), thereby increasing aperture ratio of the array substrate. In addition, the first common line 2321 can be formed in the same patterning process as the data line 2310 (for example, the first common line 2321 can be formed in the same layer as the data line 2310), and thus, aperture ratio of the array substrate can be increased without adding additional process.

For example, in the embodiment of the present disclosure, the first common line 2321 and the gate line 2520 are not short-circuited because the gate insulation layer 2400 is provided therebetween. Therefore, the first common line 2321 can extend in the column direction to form a storage capacitor with the rows of pixel electrodes to improve stability of storage capacitor, and further improve stability of display image.

Figure 3:
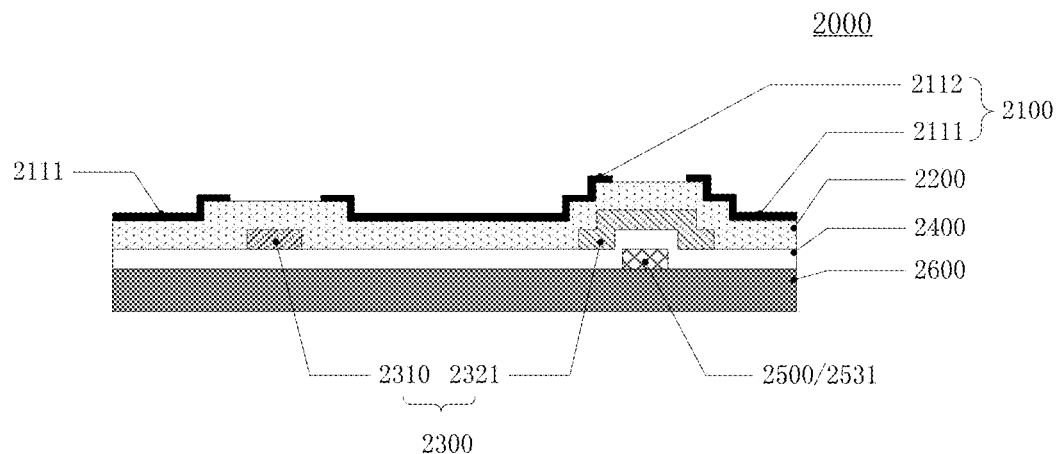
FIG. 3 is a schematic cross-sectional view of a structure of an array substrate according to another embodiment of the present disclosure.

For example, FIG. 3 illustrates a schematic cross-sectional view of a structure of an array substrate 2000 according to another embodiment of the present disclosure.

As illustrated in FIG. 3, the third electrode layer 2500 of the array substrate 2000 includes a second common line 2531, and the second common line 2531 is disposed between two pixel electrode pairs 2110 adjacent in the row direction. For example, an area of the second common line 2531 can be smaller than that of the first common line 2321, such that the first common line 2321 and the pixel electrode form a stair shaped structure in a direction substantially perpendicular to the base substrate 2600. The stair shaped structure can increase an overlapped area between the first common line 2321 and the pixel electrode, thereby increasing storage capacitance formed therebetween and further improving aperture ratio. For example, the second common line 2531 can be located directly below the first common line 2321, so that storage capacitor in the array substrate 2000 can be evenly distributed and quality of display image can be improved. For example, the second common line 2531 can be electrically connected with the first common line 2321 (for example, electrically connected through a via hole).

Figure 4:
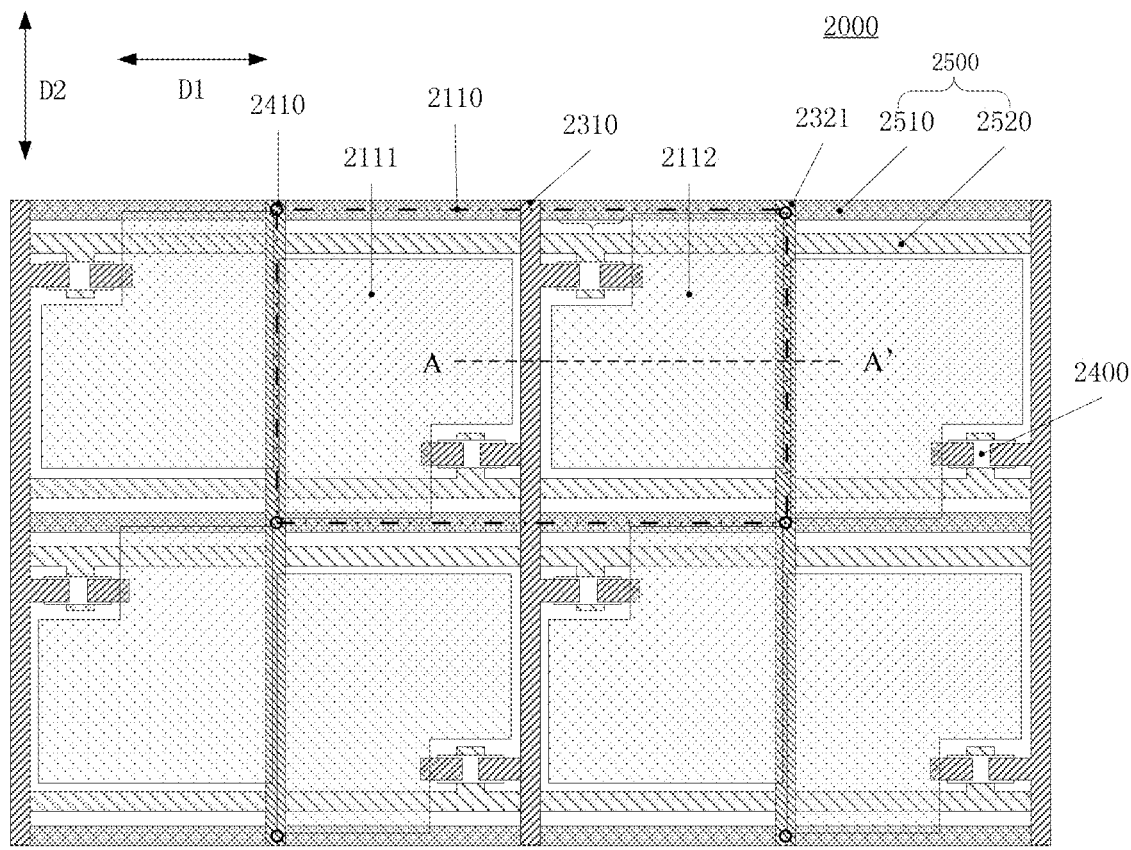
FIG. 4 is a schematic plan view of a structure of an array substrate according to still another embodiment of the present disclosure.

For example, FIG. 4 illustrates a schematic plan view of a structure of an array substrate 2000 according to another embodiment of the present disclosure.

As illustrated in FIG. 4, the third electrode layer 2500 of the array substrate 2000 includes a third common line 2510 which extends in the row direction and is partially overlapped with the second pixel electrode 2112. The first common line 2321 can be electrically connected with the third common line 2510. For example, the first common line 2321 is electrically connected with the third common line 2510 through a via hole 2410 running through the gate insulation layer 2400. Furthermore, storage capacitors formed between the first common lines 2321 and the pixel electrodes and storage capacitors formed between the third common lines 2510 and the pixel electrodes can be connected in parallel through the third common line 2510, thereby further enhancing stability of storage capacitor, and improving stability of display image.

Figure 5:
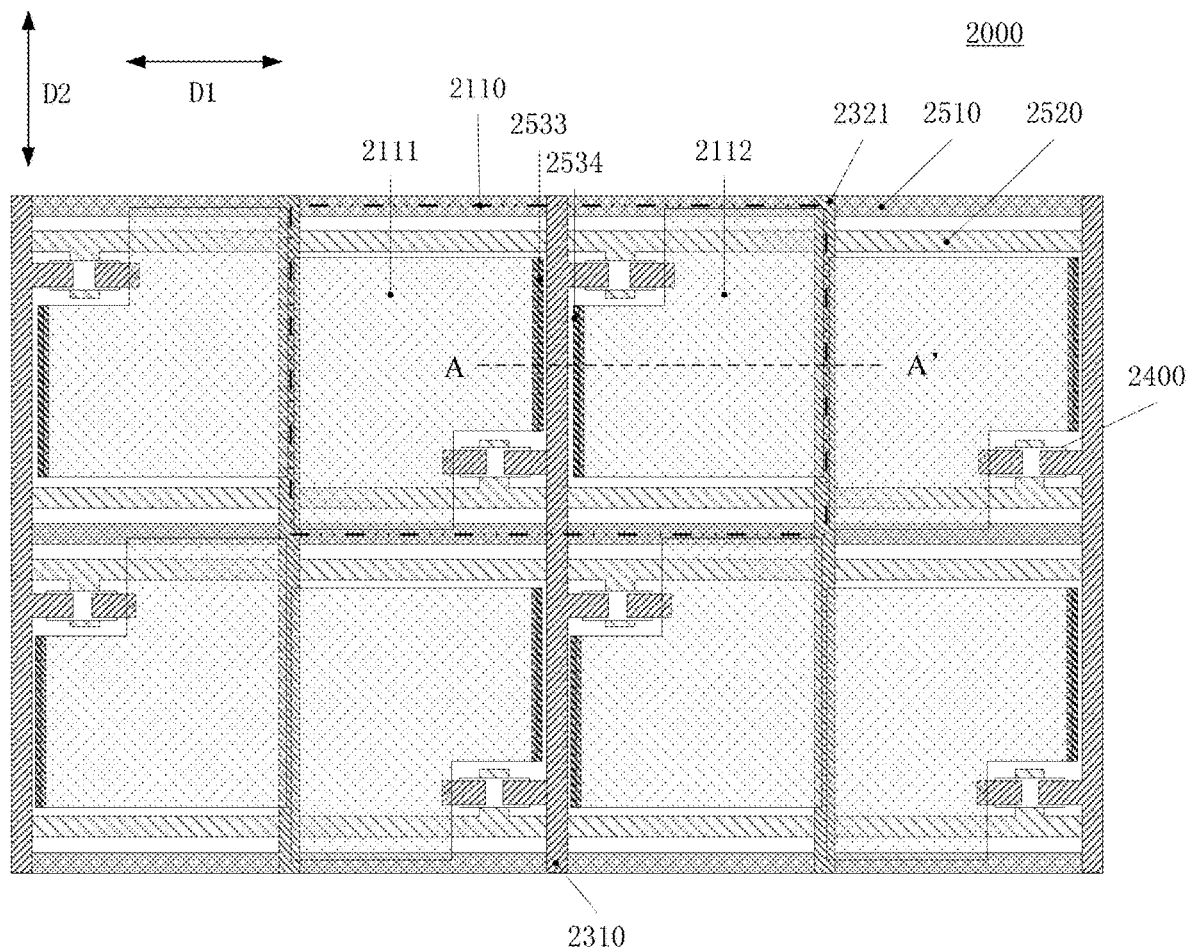
FIG. 5 (a) is a schematic plan view of a structure of an array substrate according to still another embodiment of the present disclosure.
Figure 5:
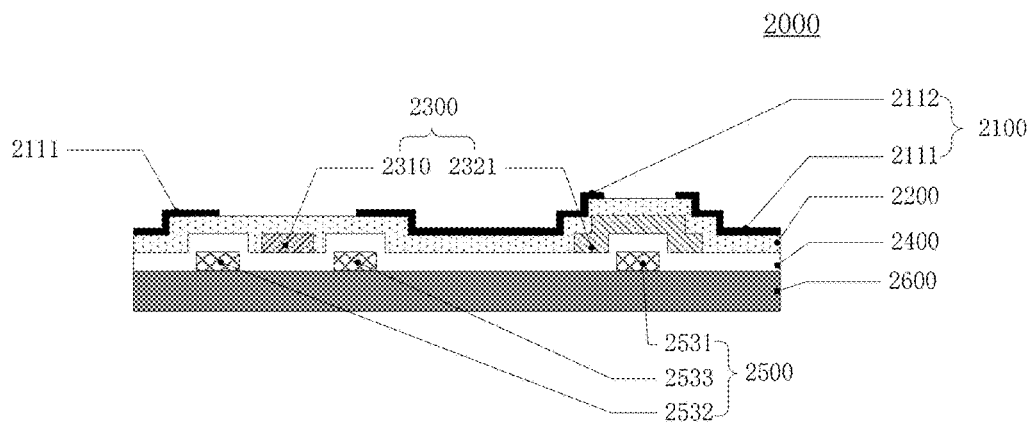
Figure 5:
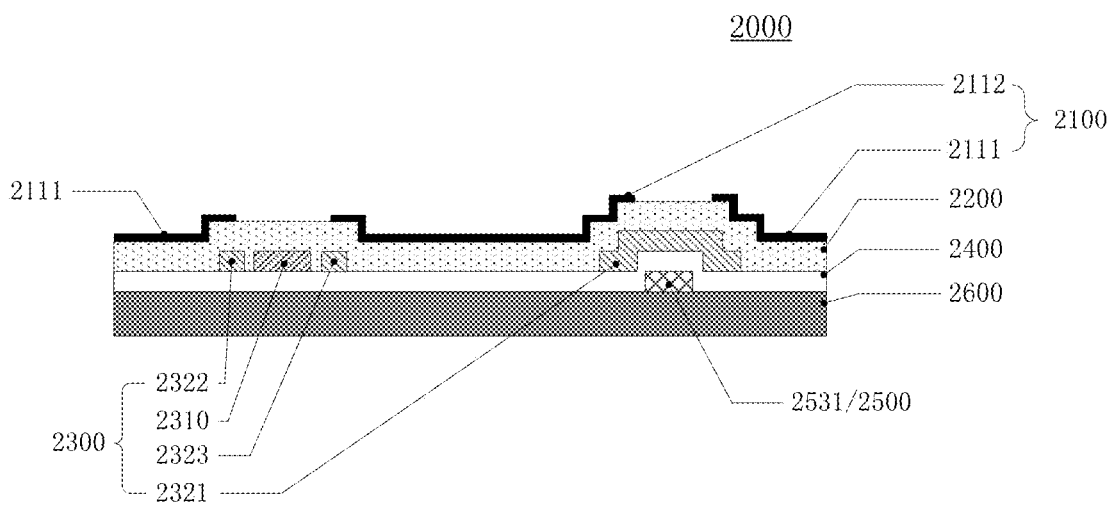
Figure 5:
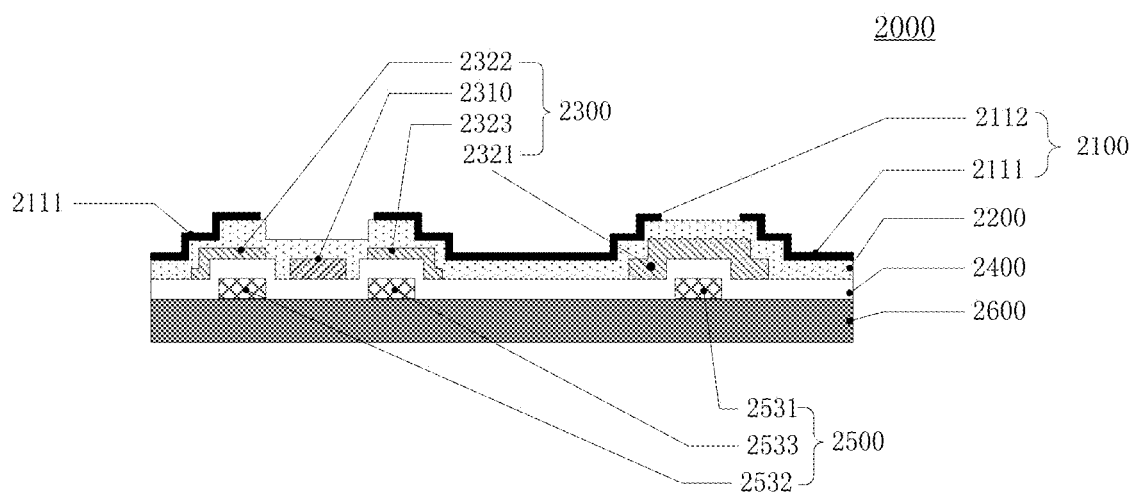

For example, FIG. 5 (*a*) and FIG. 5 (*b*) respectively illustrate a schematic plan view and a cross-sectional view of a structure of an array substrate 2000 according to another embodiment of the present disclosure.

As illustrated in FIG. 5 (*a*) and FIG. 5 (*b*), the third electrode layer 2500 of the array substrate 2000 further includes a fourth common line 2532 and a fifth common line 2533. The fourth common line 2532 is disposed on one side of the data line 2310 (for example, on the left side of the data line as illustrated in FIG. 5 (*b*)) and is partially overlapped with the pixel electrode which is adjacent to the data line 2310 (for example, the pixel electrode which is adjacent to the left side of the data line as illustrated in FIG. 5 (*b*)). The fifth common line 2533 is disposed on the other side of the data line 2310 (for example, on the right side of the data line as illustrated in FIG. 5 (*b*)), and is partially overlapped with the pixel electrode which is adjacent to the data line 2310 (for example, the pixel electrode which is adjacent to the right side of the data line as illustrated in FIG. 5 (*b*)). Therefore, a storage capacitance formed between a vertical common line and the pixel electrode can be further increased. A storage capacitance formed between the first common line 2321 and the pixel electrode can be reduced correspondingly, if a same storage capacitance is to be reached. That is, an area occupied by the first common line 2321 can be reduced accordingly, so that aperture ratio can be improved.

For example, FIG. 5 (*c*) illustrates a cross-sectional view of another structure of an array substrate 2000 according to still another embodiment of the present disclosure.

As illustrated in FIG. 5 (*c*), the second electrode layer 2300 of the array substrate 2000 includes a sixth common line 2322 and a seventh common line 2323. The sixth common line 2322 is disposed on one side of the data line 2310 (for example, on the left side of the data line as illustrated in FIG. 5 (*c*)) and is partially overlapped with the pixel electrode which is adjacent to the data line 2310 (for example, the pixel electrode adjacent to the left side of the data line). The seventh common line 2323 is disposed on the other side of the data line 2310 (for example, on the right side of the data line as illustrated in FIG. 5 (*c*)), and is partially overlapped with the pixel electrode which is adjacent to the data line 2310 (for example, the pixel electrode adjacent to the right side of the data line as illustrated in FIG. 5 (*c*)). Compared with the array substrate 2000 as illustrated in FIG. 5 (*b*), only the insulating layer 2200 is provided between the sixth common line 2322 and the pixel electrode, and between the seventh common line 2323 and the pixel electrode. Compared with the case as illustrated in FIG. 5 (*b*), the distance between the sixth common line 2322 and the pixel electrode and the distance between the seventh common line 2323 and the pixel electrode are reduced, and capacitance of storage capacitor is increased, so that aperture ratio can be further increased.

For example, FIG. 5 (*d*) illustrates a cross-sectional view of still another structure of an array substrate 2000 according to still another embodiment of the present disclosure.

Compared with the array substrates 2000 as illustrated in FIG. 5 (*b*) and FIG. 5 (*c*), the second electrode layer 2300 of the array substrate 2000 includes a sixth common line 2322 and a seventh common line 2323, and the third electrode layer 2500 includes a fourth common line and a fifth common line. The fourth common line 2532 and the fifth common line 2533 which are located in the third electrode layer 2500 enable the sixth common line 2322 and the seventh common line 2323 which are located in the second electrode layer 2300 and the corresponding pixel electrode to form a stair shaped structure in a direction substantially perpendicular to the base substrate 2600, thereby increasing storage capacitance formed between the sixth common line 2322 and the pixel electrode, and storage capacitance formed between the seventh common line 2323 and the pixel electrode, thereby further improving aperture ratio. In addition, the data line 2310 is disposed in a recess formed by the gate insulation layer 2400, and portions of the sixth common line 2322 and the seventh common line 2323 are disposed at bumps formed by the gate insulation layer 2400, thereby avoiding too short distance between the data line 2310 and the gate insulation layer 2400 or short-circuit therebetween.

For example, in the embodiments of the present disclosure, the numbers and positions of the fourth common line, the fifth common line, the sixth common line, and the seventh common line are not limited thereto as illustrated in FIGS. 5 (a) to 5 (d), which can be set according to actual light shielding requirements and required storage capacitance. For example, only the fourth common line 2532 is disposed on the third electrode layer 2500; for example, only the seventh common line 2323 is disposed on the second electrode layer 2300.

For example, according to practical application requirements, the first common line, the second common line, the third common line, the fourth common line, the fifth common line, the sixth common line, and the seventh common line of the array substrate in the above-mentioned different embodiments can be combined with each other to obtain new embodiments. For example, the number or structure of layers of the films can be increased or decreased according to actual production needs, which is not limited herein.

Herein, each of the first to seventh common lines is configured to provide a common voltage. For example, any two of the first common line to the seventh common line are electrically connected.

For example, any one of the first to seventh common lines, is electrically insulated from the pixel electrode. For example, each of the first pixel electrodes and the corresponding data line are electrically connected through a thin film transistor; and each of the second pixel electrodes and the corresponding data line are electrically connected through a thin film transistor.

For example, any one of the first to seventh common lines and any one of the first pixel electrode and the second pixel electrode are electrically insulated from each other.

Herein, the structures in the same layer can be formed by the same one patterning process.

Herein, the expression "orthographic projection on the base substrate" means "a projection in a direction substantially perpendicular to a main surface of the base substrate".

Figure 6:
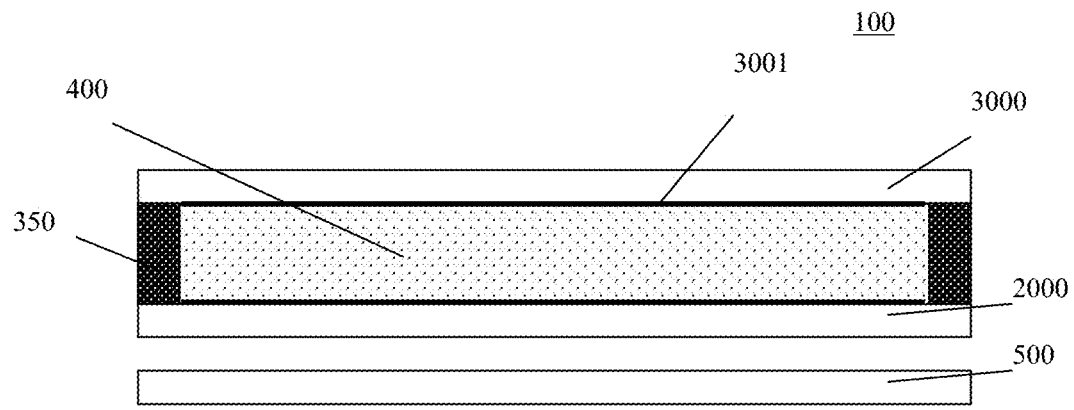
FIG. 6 is a schematic diagram of a display panel according to still another embodiment of the present disclosure.

For example, a further embodiment of the present disclosure provides a display panel 100. As illustrated in FIG. 6, the display panel 100 includes the array substrate 2000 according to any one of the embodiments of the present disclosure. For example, the display panel can improve aperture ratio without adding an additional process, and can enhance stability of storage capacitor and stability of display image. For example, in the embodiment of the present disclosure, the display panel 100 can further include a color filter substrate 3000. The color filter substrate 3000 can include a black matrix 3001 corresponding to a region between the pixel electrodes of the array substrate 2000 to shield light passing through a gap between the pixel electrodes on the array substrate and enhance image contrast. The array substrate 2000 and the color filter substrate 3000 are assembled with each other by a sealant 350 to form a liquid crystal cell. The liquid crystal cell 400 is filled with the liquid crystal material 400. A backlight module 500 can also be provided on the non-display side (the lower side in FIG. 6) of the liquid crystal panel to provide a light source for display operation of the display panel.

Figure 7:
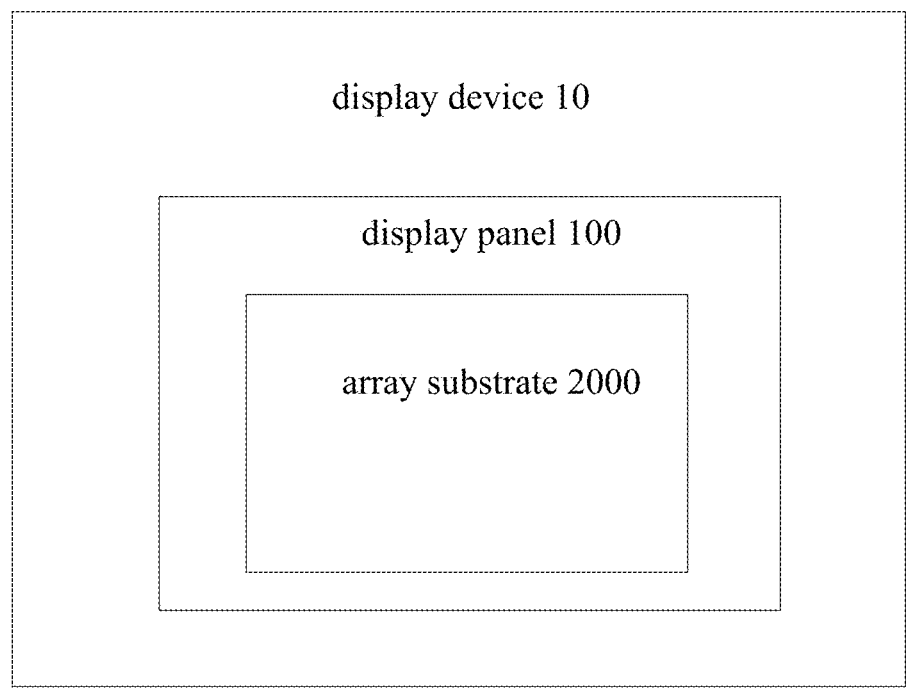
FIG. 7 is a schematic diagram of a display device provided by still another embodiment of the present disclosure.

For example, a further embodiment of the present disclosure provides a display device 10, as illustrated in FIG. 7, including a display panel 100. The display panel 100 includes the array substrate 2000 according to any one of the embodiments of the present disclosure.

For example, the display device 10 can be any product or component having a display function, such as a mobile phone, a tablet computer, a television, a display, a notebook computer, a digital photo frame, a navigator and the like.

It should be noted that, other indispensable components of the display device should be understood by those of ordinary skill in the art, and will not be described in detail herein, and which should not be construed as a limit of the present disclosure. The display device can improve aperture ratio without adding an additional process, and can enhance stability of storage capacitor and stability of display image.

Figure 8:
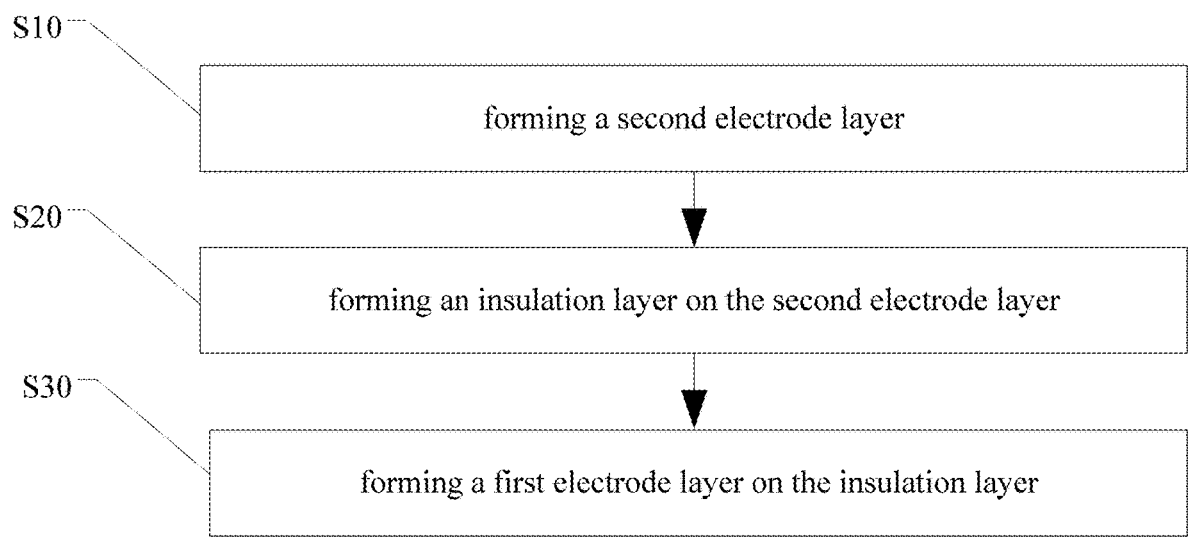
FIG. 8 is a flowchart of a manufacturing method of an array substrate according to still another embodiment of the present disclosure.

For example, based on the same inventive concept, the embodiments of the present disclosure further provide a manufacturing method of the array substrate 2000 according to the embodiments of the present disclosure. Taking the cases as illustrated in FIG. 2 (a) and FIG. 2 (b) as examples. As illustrated in FIG. 8, the manufacturing method can include the following steps:

step S10: forming a second electrode layer 2300, the second electrode layer 2300 including a data line 2310 and a first common line 2321;

step S20: forming an insulation layer 2200 on the second electrode layer 2300;

step S30: forming a first electrode layer 2100 on the insulation layer 2200, wherein, the first electrode layer 2100 includes a plurality of pixel electrode pairs 2110 distributed in an array, each pixel electrode pair 2110 includes a first pixel electrode 2111 and a second pixel electrode 2112 which is adjacent to the first pixel electrode 2111 in the row direction, a data line is located between the first pixel electrode 2111 and the second pixel electrode 2112 in the row direction, and a first common line 2321 is located between two pixel electrode pairs 2110 adjacent in the row direction, and the first common line 2321 is partially overlapped with the pixel electrode(s) in the two pixel electrode pairs 2110.

In the manufacturing method of the array substrate 2000 provided by the embodiment of the present disclosure, a distance between the pixel electrode and the third common line is reduced because only the insulation layer 2200 is provided therebetween, thereby increasing storage capacitance formed between the pixel electrode and the third common line. In a case that the same capacitance value is to be reached, the overlapped area between the pixel electrode and the first common line can be reduced accordingly. That is, an area occupied by the first common line can be reduced correspondingly, thereby increasing aperture ratio. Because the first common line 2321 can be formed in the same process as the data line 2310 (for example, the first common line can be formed in the same layer as the data line), storage capacitance and aperture ratio can be increased without adding an additional processes.

For example, because the gate insulation layer 2400 is provided between the first common line and the gate line 2520, the first common line and the gate line 2520 are not short-circuited. The first common line can extend continuously in the column direction and storage capacitors formed by the first common line and a whole column of pixel electrodes are connected in parallel, so that stability of storage capacitor and stability of display image can be improved without adding an additional process.

For example, in the manufacturing method of the array substrate 2000 provided by the embodiment of the present disclosure, the method further includes providing a base substrate 2600, forming a third electrode layer 2500 on the base substrate 2600, forming a gate insulation layer 2400 on the third electrode layer 2500; the second electrode layer 2300 is located on the gate insulation layer 2400.

Obviously, the manufacturing method of the array substrate provided by the embodiments of the present disclosure is not limited to the cases as illustrated in FIG. 2 (a) and FIG. 2 (b), can also include the cases as illustrated in FIG. 3, FIG. 4, FIG. 5 (a)~FIG. 5 (b)).

For example, in the manufacturing method of the array substrate 2000 provided in the embodiments of the present disclosure, the third electrode layer 2500 can include a second common line 2531 located between two pixel electrode pairs 2110 adjacent in the row direction (referring to FIG. 3). For example, an area of the second common line 2531 can be smaller than that of the first common line 2321, and a stair shaped structure can increase the overlapped area of the first common line 2321 and the pixel electrode, thereby increasing storage capacitance formed therebetween, and improving aperture ratio.

For example, in the manufacturing method of the array substrate 2000 provided by the embodiment of the present disclosure, the third electrode layer 2500 includes a third common line 2510 extending in the row direction, and an orthographic projection of the third common line 2510 on the base substrate is at least partially overlapped with an orthographic projection of at least one pixel electrode of the pixel electrode pair 2110 on the base substrate (referring to FIG. 4).

For example, in the manufacturing method of the array substrate 2000 provided by the embodiment of the present disclosure, the method further includes forming a via hole 2410 in the gate insulation layer 2400. The first common line 2321 is electrically connected with the third common line 2510 through the via hole 2410, so that all the storage capacitors formed between of the first common lines 2321 and the pixel electrodes and storage capacitors formed between the third common line 2510 and the pixel electrodes can connected in parallel through the third common line to further enhance stability of storage capacitor, and enhance stability of display image.

For example, the manufacturing method of the array substrate 2000 provided by the embodiment of the present disclosure further includes forming a fourth common line and a fifth common line in the third electrode layer 2500, and the fourth common line 2532 is disposed on a side of the data line 2310 (for example, the left side of the data line as illustrated in FIG. 5 (*b*)) and is partially overlapped with the pixel electrode adjacent to the data line 2310 (for example, the pixel electrode adjacent to the left side of the data line as illustrated in FIG. 5 (*b*)). The fifth common line 2533 is disposed on the other side of the data line 2310 (for example, the right side of the data line as illustrated in FIG. 5 (*b*)) and is partially overlapped with the pixel electrode adjacent to the data line 2310 (for example, the pixel electrode adjacent to the right side of the data line as illustrated in FIG. 5 (*b*)). Thus, storage capacitance is further increased, and aperture ratio is improved.

For example, in the manufacturing method of the array substrate 2000 provided by the embodiment of the present disclosure, the method further includes forming a sixth common line and a seventh common line in the second electrode layer 2300, the sixth common line 2322 is disposed on a side of the data line 2310 (for example, the left side of the data line as illustrated in FIG. 5 (*c*)) and is partially overlapped with the pixel electrode adjacent to the data line 2310 (for example, the pixel electrode adjacent to the left side of the data line as illustrated in FIG. 5 (*c*)). The seventh common line 2323 is disposed on the other side of the data line 2310 (for example, on the right side of the data line as illustrated in FIG. 5 (*c*)), and is partially overlapped with the pixel electrode adjacent to the data line 2310 (for example, the pixel electrode adjacent to the right side of the data line as illustrated in FIG. 5 (*c*)). As a result, storage capacitance formed by a vertical common line and the pixel electrode can be further increased, and aperture ratio can be further improved.

Embodiments of the present disclosure provide an array substrate, a manufacturing method thereof, a display panel and a display device, which can increase storage capacitance and increase aperture ratio without adding an additional process, and can enhance stability of storage capacitor and stability of display image.

The foregoing is merely exemplary embodiments of the present disclosure, and is not intended to limit the protection scope of the present disclosure. The protection scope of the disclosure is determined by the appended claims.

The application claims priority to the Chinese patent application No. 201610849815.6, filed Sep. 26, 2016, the entire disclosure of which is incorporated herein by reference as part of the present application.

The invention claimed is:

1. An array substrate, comprising:
 a base substrate;
 a first electrode layer comprising a plurality of pixel electrode pairs arranged in an array, each of the pixel electrode pairs comprising a first pixel electrode and a second pixel electrode which is adjacent to the first pixel electrode in a row direction;
 a data line disposed between the first pixel electrode and the second pixel electrode of a same pixel electrode pair in the row direction and extending in a column direction; and
 a first common portion, an orthographic projection of the first common portion on the base substrate being at least partially overlapped with an orthographic projection of at least one of adjacent first pixel electrode or second pixel electrode of two adjacent pixel electrode pairs in the row direction on the base substrate, the first common portion and the first electrode layer being insulated from each other,
 the array substrate further comprising: at least one of a sixth common line or a seventh common line, wherein the sixth common line is disposed on a first side of the data line, and an orthographic projection of the first pixel electrode adjacent to the data line on the base substrate is at least partially overlapped with an orthographic projection of the sixth common line on the base substrate; and the seventh common line is disposed on a second side of the data line opposite to the first side, and an orthographic projection of the second pixel electrode adjacent to the data line on the base substrate is at least partially overlapped with an orthographic projection of the seventh common line on the base substrate.

2. The array substrate according to claim 1, wherein the data line and the first common portion is included in a second electrode layer which is different from the first electrode layer.

3. The array substrate according to claim 1, wherein the first common portion is a first common line extending in the column direction.

4. The array substrate according to claim 1, further comprising:
 a third electrode layer disposed on the base substrate;
 a gate insulation layer disposed on the third electrode layer, the data line and the first common portion being disposed on the gate insulation layer; and
 an insulation layer disposed on the data line and the first common portion, the first electrode layer being disposed on the insulation layer.

5. The array substrate according to claim 4, wherein the third electrode layer comprises a second common line, an orthographic projection of the second common line on the base substrate is overlapped with the orthographic projection of the first common portion on the base substrate.

6. The array substrate according to claim 5, wherein the orthographic projection of the second common line on the base substrate is not overlapped with an orthographic projection of the first pixel electrode and second pixel electrode adjacent to each other on the base substrate.

7. The array substrate according to claim 4, wherein the third electrode layer comprises a third common line which extends in the row direction, and an orthographic projection of the third common line on the base substrate is at least partially overlapped with an orthographic projection of at least one of the first pixel electrode or the second pixel electrode of at least one of the pixel electrode pairs on the base substrate.

8. The array substrate according to claim 7, wherein the first common portion is electrically connected with the third common line.

9. The array substrate according to claim 1, further comprising at least one of a fourth common line or a fifth common line, wherein the fourth common line is disposed on a first side of the data line, and an orthographic projection of the first pixel electrode adjacent to the data line on the base substrate is at least partially overlapped with an orthographic projection of the fourth common line on the base substrate; and the fifth common line is disposed on a second side of the data line opposite to the first side, and an orthographic projection of the second pixel electrode adjacent to the data line on the base substrate is at least partially overlapped with an orthographic projection of the fifth common line on the base substrate.

10. The array substrate according to claim 9, wherein at least one of the fourth common line or the fifth common line is included in a third electrode layer.

11. The array substrate according to claim 1, wherein at least one of the sixth common line or the seventh common line is included in a second electrode layer.

12. A display panel comprising the array substrate according to claim 1.

13. A display device comprising the display panel according to claim 12.

14. A manufacturing method of an array substrate, comprising:
    providing a base substrate;
    forming a data line and a first common portion on the base substrate; and
    forming a first electrode layer on the data line and the first common portion;
    wherein, a first electrode layer comprises a plurality of pixel electrode pairs arranged in an array, each of the pixel electrode pairs comprises a first pixel electrode and a second pixel electrode which is adjacent to the first pixel electrode in a row direction; the data line is disposed between the first pixel electrode and the second pixel electrode of a same pixel electrode pair in the row direction; and the first common portion is located between two pixel electrode pairs in the row direction, an orthographic projection of the first common portion on the base substrate is at least partially overlapped with an orthographic projection of at least one of adjacent first pixel electrode or second pixel electrode of two pixel electrode pairs in the row direction on the base substrate, the first common portion and the first electrode layer are insulated from each other, the method further comprising:
    forming at least one of a sixth common line or a seventh common line, wherein the sixth common line is disposed on a first side of the data line and an orthographic projection of the first pixel electrode adjacent to the data line on the base substrate is at least partially overlapped with an orthographic projection of the sixth common line on the base substrate; and the seventh common line is disposed on a second side of the data line opposite to the first side, and an orthographic projection of the second pixel electrode adjacent to the data line on the base substrate is at least partially overlapped with an orthographic projection of the seventh common line on the base substrate.

15. The method according to claim 14, further comprising:
    forming a third electrode layer on the base substrate;
    forming a gate insulation layer on the third electrode layer, the data line and the first common portion being located on the gate insulation layer.

16. The method according to claim 15, wherein the third electrode layer comprises a second common line, an orthographic projection of the second common line on the base substrate is overlapped with the orthographic projection of the first common portion on the base substrate.

17. The method according to claim 15, wherein the third electrode layer comprises a third common line which extends in the row direction, and an orthographic projection of the third common line on the base substrate is at least partially overlapped with an orthographic projection of at least one of the first pixel electrode or the second pixel electrode of at least one of the pixel electrode pairs on the base substrate.

18. The method according to claim 14, further comprising forming at least one of a fourth common line or a fifth common line, wherein the fourth common line is disposed on a first side of the data line, and an orthographic projection of the first pixel electrode adjacent to the data line on the base substrate is at least partially overlapped with an orthographic projection of the fourth common line on the base substrate; and the fifth common line is disposed on a second side of the data line opposite to the first side, and an orthographic projection of the second pixel electrode adjacent to the data line on the base substrate is at least partially overlapped with an orthographic projection of the fifth common line on the base substrate.

* * * * *